US009353971B2

(12) United States Patent
Loeckenhoff

(10) Patent No.: US 9,353,971 B2
(45) Date of Patent: May 31, 2016

(54) SOLAR GENERATOR UNIT

(71) Applicant: AZUR SPACE Solar Power GMBH, Heilbronn (DE)

(72) Inventor: Ruediger Loeckenhoff, Bietigheim-Bissingen (DE)

(73) Assignee: Azur Space Solar Power GmbH, Heilbronn (DE)

( * ) Notice: Subject to any disclaimer, the term of this patent is extended or adjusted under 35 U.S.C. 154(b) by 163 days.

(21) Appl. No.: 14/064,809

(22) Filed: Oct. 28, 2013

(65) Prior Publication Data
US 2014/0048120 A1 Feb. 20, 2014

Related U.S. Application Data

(63) Continuation of application No. PCT/EP2012/001835, filed on Apr. 26, 2012.

(60) Provisional application No. 61/480,750, filed on Apr. 29, 2011.

(30) Foreign Application Priority Data

Apr. 28, 2011 (EP) .................................... 11003503

(51) Int. Cl.
*F24J 2/38* (2014.01)
*H01L 31/052* (2014.01)
*F03G 6/06* (2006.01)
(Continued)

(52) U.S. Cl.
CPC ... *F24J 2/38* (2013.01); *F03G 6/06* (2013.01); *F24J 2/07* (2013.01); *F24J 2/5424* (2013.01); *H01L 31/0525* (2013.01); *H01L 31/0547* (2014.12); *F24J 2/12* (2013.01);
(Continued)

(58) Field of Classification Search
CPC .................. F03G 6/06; F24J 2/07; F24J 2/12; F24J 2/38; F24J 2/5424; F24J 2002/5458; F24J 2002/5465; F24J 2002/5468; F24J 2/5427; H01L 31/0547; Y02E 10/47; Y02E 10/52; H02S 20/32
See application file for complete search history.

(56) References Cited

U.S. PATENT DOCUMENTS 4,395,581 A 7/1983 Girard
4,548,195 A * 10/1985 Balhorn ........................ 126/602
(Continued)

FOREIGN PATENT DOCUMENTS

| CN | 101728981 A | 6/2010 |
| EP | 2 180 524 A2 | 4/2010 |
| WO | WO 02/079793 A1 | 10/2002 |

*Primary Examiner* — Marla D McConnell
(74) *Attorney, Agent, or Firm* — Muncy, Geissler, Olds & Lowe, P.C.

(57) ABSTRACT

A solar generator unit for converting sunlight, having a mirror array, a light converter, support designed to hold the mirror array, and a tracking unit for causing the mirror array to track the sun position. The light converter is arranged above the mirror array and the concentrated light strikes a receiver surface of the light converter. The support has an essentially horizontal first shaft with a first radial bearing point and a second radial bearing point arranged on mutually opposite sides of the mirror array. A third radial bearing point accommodates a second shaft that is essentially perpendicular to the first shaft is flange-mounted between the first bearing point and the second bearing point so that the axis of rotation of the second shaft is pivoted along with a rotation of the first shaft, and the mirror array is connected in a non-positive way to the second shaft.

15 Claims, 3 Drawing Sheets

(51) Int. Cl.
*F24J 2/54* (2006.01)
*F24J 2/07* (2006.01)
*H01L 31/054* (2014.01)
*F24J 2/12* (2006.01)

(52) U.S. Cl.
CPC ................ *Y02E 10/41* (2013.01); *Y02E 10/46* (2013.01); *Y02E 10/47* (2013.01); *Y02E 10/52* (2013.01)

(56) References Cited

U.S. PATENT DOCUMENTS

| | | | |
|---|---|---|---|
| 8,188,415 | B2 | 5/2012 | Kats et al. |
| 2004/0079863 | A1 | 4/2004 | Lasich |
| 2010/0000519 | A1* | 1/2010 | Zalusky et al. ............... 126/601 |
| 2010/0326521 | A1* | 12/2010 | Rabinowitz ................... 136/259 |

* cited by examiner

SOLAR GENERATOR UNIT

This nonprovisional application is a continuation of International Application No. PCT/EP2012/001835, which was filed on Apr. 26, 2012, and which claims priority to European Patent Application No. 11003503.7, which was filed on Apr. 28, 2011, and to U.S. Provisional Application No. 61/480,750, which was filed on Apr. 29, 2011, and which are all herein incorporated by reference.

BACKGROUND OF THE INVENTION

1. Field of the Invention

The invention relates to a solar generator unit.

2. Description of the Background Art

Known from the product catalog at http://www.solarsystems.com.au is a solar generator unit with dual axis tracking. In this system, the mirror array is arranged on a mast. From EP 2 180 524 A2, which corresponds to U.S. Pat. No. 8,188,415, is known another arrangement of a solar cell array consisting of flat modules. The individual modules have a plurality of individual solar cells, wherein the light is concentrated by means of imaging optics onto the solar cells arranged beneath the optics.

In addition, another solar generator unit is known from U.S. Pat. No. 4,548,195. In this design, the light converter is connected to the base or ground in a fixed manner by a holding fixture. The sunlight is directed to the light converter by means of rotating reflector segments.

SUMMARY OF THE INVENTION

It is therefore an object of the present invention to provide a device that advances conventional.

According to an embodiment of the invention, a solar generator unit for converting sunlight is provided, having a mirror array designed to concentrate the received sunlight, and having a light converter, and having a support designed to hold the mirror array, and having a tracking unit designed to cause the mirror array to track the sun position during the course of the day, wherein the light converter is arranged above the mirror array in the direction of the incident sunlight, and the concentrated light strikes a receiver surface of the light converter, and the light converter is coupled in a fixed manner to the mirror array so that the light converter is carried along during tracking of the mirror array, wherein the support has an essentially horizontal first shaft, and the first shaft has a first radial bearing point and a second radial bearing point arranged on mutually opposite sides of the mirror array, and the first bearing point and the second bearing point are aligned with the center axis of the first shaft, and a third radial bearing point for accommodating a second shaft that is essentially perpendicular to the first shaft is flange-mounted between the first bearing point and the second bearing point so that the axis of rotation of the second shaft is pivoted along with a rotation of the first shaft, and the mirror array is connected in a non-positive way to the second shaft, and the mirror array has multiple segments, and a first gap is formed between a portion of the segments, and the first gap has a clear opening equal to at least the diameter of the first shaft and/or of the second shaft, and the first shaft supports the weight of the second shaft and mirror array, and the tracking unit is designed to orient the mirror array to the sun position by rotation of the first and second shafts. It should be noted that the fact that the light converter is coupled in a fixed manner to the mirror array has the result that the light converter is always of necessity carried along during tracking of the mirror array. In particular, the tracking unit brings about tracking of the mirror array by rotating the two shafts, and in this way the mirror array is always aligned toward the sun during the course of the day. In addition, it should be noted that the fact that the light converter is connected in a non-positive way to the second shaft has the result that the first shaft supports the entire weight of the second shaft, mirror array, and light converter.

It is an advantage of the device according to an embodiment of the invention that the solar generator unit constitutes a modular arrangement, and the modular arrangement can be produced and set up easily and economically. As a result of the novel construction, which is especially flat, particularly due to a horizontal first shaft, even a modest height above a base or the ground is sufficient for the mirror array. In this design, the first shaft is connected at both ends to the base in a non-positive way by a bar-shaped attachment, preferably below the applicable bearing points. In addition, the weight of the individual parts is low, so the solar generator unit can be set up on site without special lifting equipment such as cranes, in contrast to a mast arrangement. In particular, as a result of the fact that the mirror array is divided into individual segments and, according to a preferred embodiment, the segments are arranged close to the ground around a second shaft on both sides, the wind load of the entire arrangement can be reduced considerably in comparison to an individual arrangement with a mast. Furthermore, the individual segments can be implemented such that the structural integrity or deflection due to the segment's own weight is smaller than is the case for large mirror surfaces, which bend under their own weight with the result that the outer parts of the mirror surfaces are no longer precisely aligned, depending on the orientation of the mirror array.

Investigations by the applicant have shown that, as a result of the special arrangement of two axes of rotation, wherein a rotation of the first shaft is associated with pivoting of the second shaft, it is possible to achieve tracking of the mirror array to the sun position over the course of the day even with small rotational movements of the two shafts. In particular, the arrangement is suitable by preference for areas with a latitude of less than 40°. For this purpose, the first shaft is preferably arranged in the north-south direction. During the course of a day, the tracking is carried out by means of the first actuator in order to follow the sun on its path through the zenith. Meanwhile, the second actuator at the second shaft performs only small corrections from time to time in comparison with the movements of the first actuator.

In an alternative embodiment, the first shaft is rotated out of the north-south direction by a certain angle. The deviation can easily be compensated by rotation of the second shaft. In this way, the solar generator unit can also be arranged on bases that do not have an exact north-south orientation, such as a roof surface, for example.

Another advantage of the segmentation of the mirror arrangement is that gaps can be made between the individual segments of the mirror arrangement so that collision of the individual segments of the mirror arrangement during rotation of the solar generator about the axis of the second shaft is precluded.

A further advantage of the segmented arrangement is that the light converter and the holding fixture of the light converter can be positioned above the mirror arrangement such that the shadows cast by the two parts fall into a gap between the segments. As a result, the efficiency of the arrangement can be increased while at the same time a savings in expensive mirror surface can be achieved.

In a further development, the shafts are implemented as torsion tubes. Alternatively, bars or polygonal rods may also be used. In addition, it is preferred for all segments of the mirror array to be arranged in a non-positive fashion on or at the second shaft.

In an embodiment, a portion of the segments of the mirror array can be connected to the second shaft to form a second gap, and for the gap can have a clear opening equal to at least the diameter of the second shaft. To this end, two segments of the mirror array are arranged on each of the two sides of the second shaft. With respect to the first shaft, two of the mirrors are likewise arranged on each of the two sides of the first shaft. However, all segments are connected in a non-positive and fixed manner to the second shaft alone. With respect to the second shaft, the first shaft divides the second shaft into two halves, preferably of equal length, so that two segments of the mirror array are connected in a fixed manner to each half of the second shaft. Investigations of the applicant have shown that the use of exactly four mirror segments of equal size is preferred, wherein the segments are implemented as part of a parabolic mirror array that concentrates the light onto a receiver surface of the light converter. Moreover, it is preferred for two segments at a time to form a gap, either the first gap for accommodating the first shaft or the second gap for the second shaft. In this context, each of the four mirror segments can either have one continuous mirror surface, or can be composed of multiple subsegments.

According to another embodiment, the third bearing can be flange-mounted essentially in the center with respect to the longitudinal extent of the second shaft. Preferably the support is designed to transfer the weight of the segments that are connected to the second shaft to the first shaft alone. It is additionally preferred for the center of gravity of the mirror array to be placed essentially at the axis of rotation of the first shaft and/or the second shaft. In this way, a low wind load and a high mechanical load-bearing capacity of the overall solar generator unit are achieved.

In an embodiment, the first shaft has a first actuator for rotation. In addition, the second shaft likewise has a second shaft for rotation. The two actuators are connected to the tracking unit and are controlled by the tracking unit in such a manner that the mirror array and light converter are aligned exactly with the sun in each case. It is preferred for only a single actuator to be provided for each shaft.

In another embodiment, multiple solar generator units are arranged together on one first shaft so that a single first actuator is sufficient for pivoting multiple second shafts. In addition, it is preferred for multiple second shafts to be coupled to one another in such a manner that when the second shaft is rotated, the other coupled second shafts are rotated with it. Preferably the coupling takes place using the principle of parallelogram linkage. To this end, the light converters are preferably connected in a non-positive way to a push rod in such a manner that their spacing remains constant during rotation of the second shafts. In other words, the multiple second shafts are coupled together in such a manner that when one of the multiple second shafts rotates about the shaft axis, the coupled second shafts are rotated with it.

According to a preferred embodiment, the light converter comprises a solar cell, in particular a triple solar cell or a steam generator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention is explained in detail below with reference to the drawings. Like parts are labeled with identical designations here. The embodiments shown are highly schematic, which is to say that the distances and lateral and vertical extent are not to scale, and unless otherwise specified also do not have any derivable geometric relationship to one another. In the drawings.

DETAILED DESCRIPTION

Figure 1:
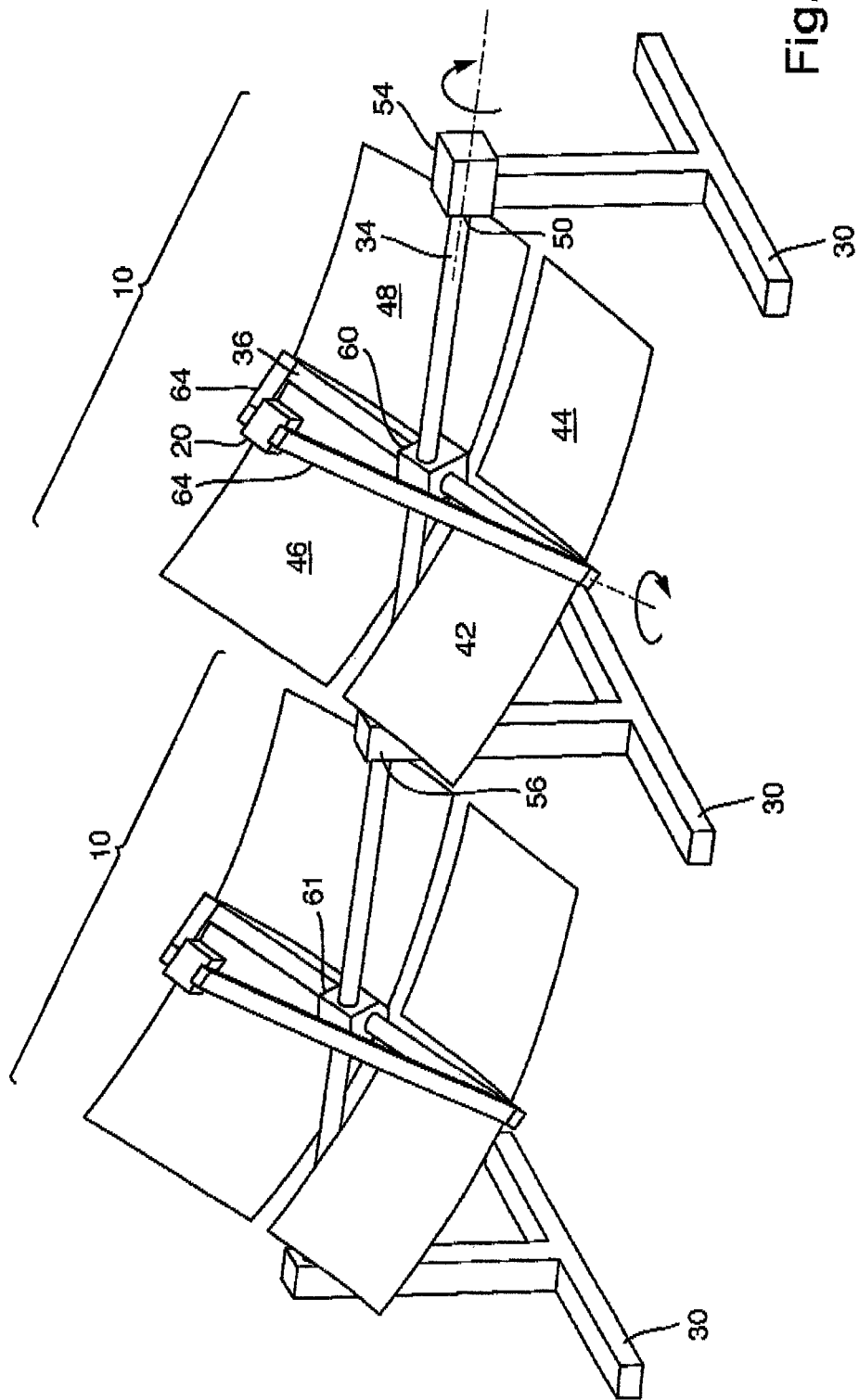
FIG. 1 shows a schematic view of an embodiment a solar generator unit.

The illustration in FIG. 1 shows a schematic view of a first embodiment, having a solar generator unit 10 with a light converter 20, a support 30 with a first horizontal shaft 34 and with a second shaft 36 flange-mounted to the first shaft 34 and with a mirror array with four segments 42, 44, 46 and 48, and a tracking unit (not shown). The four segments 42, 44, 46 and 48 preferably constitute a part of a parabolic mirror. The first shaft 34 has a first bearing point 50 with a first actuator 54 and has a second bearing point 56. The first bearing point 50 and second bearing point 56 are implemented as radial bearings and preferably each comprise a rolling element bearing, and align with the center axis of the first shaft. Implemented between the first bearing point 50 and the second bearing point 56 are the four segments 42, 44, 46 and 48 of the mirror array, wherein the segments 42, 44, 46 and 48 are connected solely to the second shaft 36 in a non-positive way, and preferably are connected thereto in a fixed manner. The second shaft 36 has a third bearing point with a second actuator 60 at the flange-mounting point to the first shaft 34, and is attached to the first shaft 34 in the center with respect to the longitudinal extent. It is preferred for the third bearing point to comprise a radial bearing. Above the segments 42, 44, 46 and 48, a receiver surface of the light converter 20 is arranged in the focal surface of the mirror array. The light converter 20 is connected to the second shaft 36 in a non-positive and fixed manner by a bar-shaped holding fixture 64. Formed between the individual segments is either a first gap for accommodating the first shaft 34 or a second gap for accommodating the second shaft 36. Because two of the four segments 42, 44, 46 and 48 are arranged on one side of either the first shaft 34 or one side of the second shaft 36 of the mirror array in each case, the center of gravity of the mirror array is located essentially in the vicinity of or on the axis of the first shaft 34.

Because the light converter is coupled in a fixed manner to the second shaft 36, when tracking of the mirror array takes place through rotation of the first shaft 34 and/or of the second shaft 36, the light converter 20 is moved along with the shaft. This ensures that the receiver surface of the light converter 20 is always positioned in the focal surface of the mirror array. The rotation of the shafts 34, 36 is accomplished by control of the first actuator 54 and control of the second actuator 60 by the tracking unit, which is electrically connected to the actuators.

As a result of the special arrangement of the segments 42, 44, 46 and 48 as quadrants of a cross, collision of the mirror surfaces with one of the two shafts 34, 36 can be precluded. Moreover, with an appropriate design, the shadow of the shafts always falls into the gap between two segments when oriented toward the sun. In this way, shading of the segments is avoided. The arrangement according to the invention has special advantages, particularly in regions near the equator with a latitude less than 40°, preferably less than 30°, where the sun crosses the zenith. For this purpose, the first shaft 34 is arranged essentially in the north-south direction.

It is advantageous to arrange multiple solar generator units 10 on a first shaft 34, as is shown in FIG. 1 using two solar generator units 10 by way of example. Tracking of the first shaft 34 is preferably accomplished with the first actuator 54, while the second shaft 36 of the additional solar generator unit 10 has a separate actuator 61. Accordingly, dual axis sun tracking of the two solar generators 10 is carried out with only three actuators instead of four actuators, and considerable costs can be saved as a result.

Figure 2:
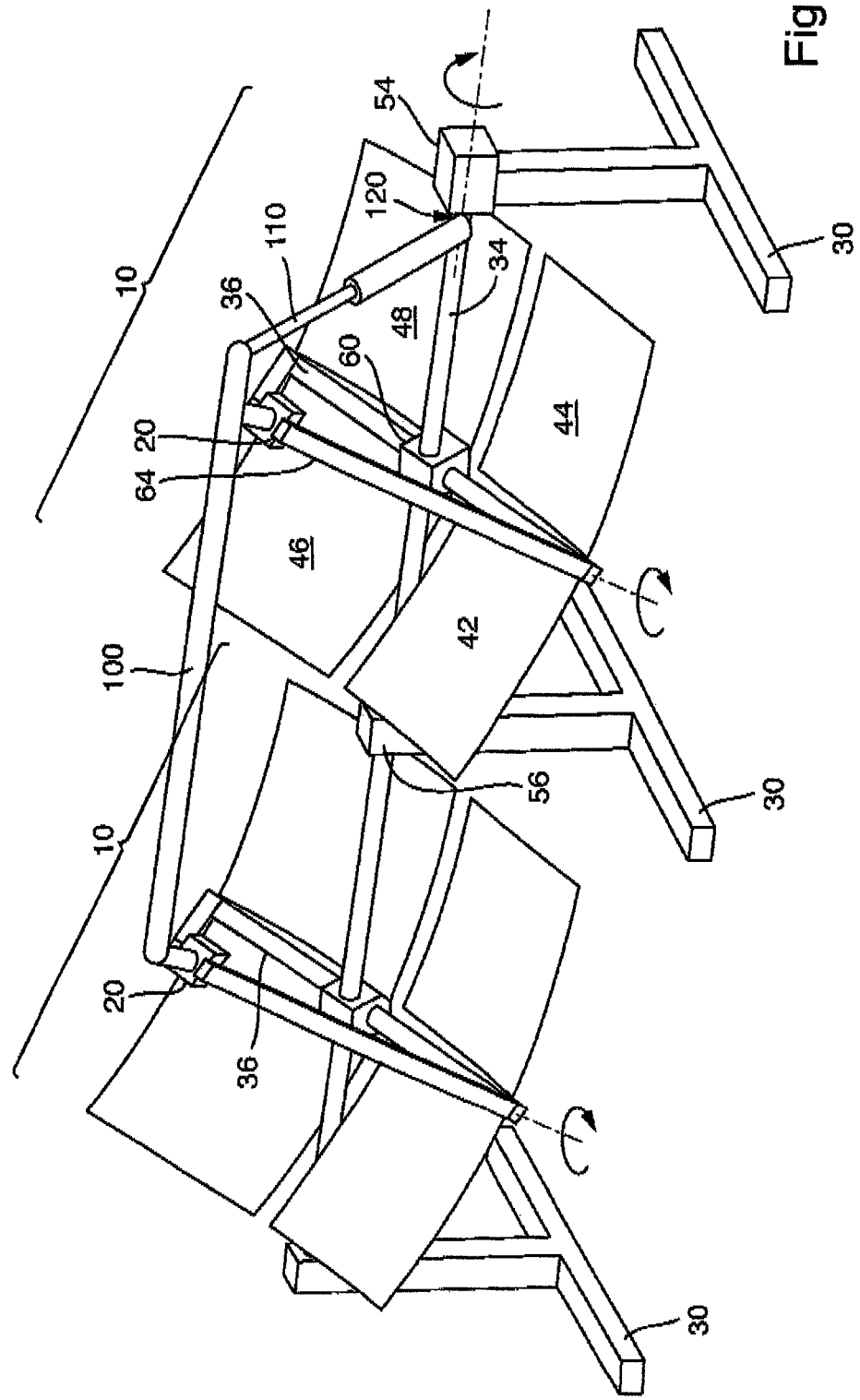
FIG. 2 shows a schematic view of an embodiment the solar generator unit.
Figure 3:
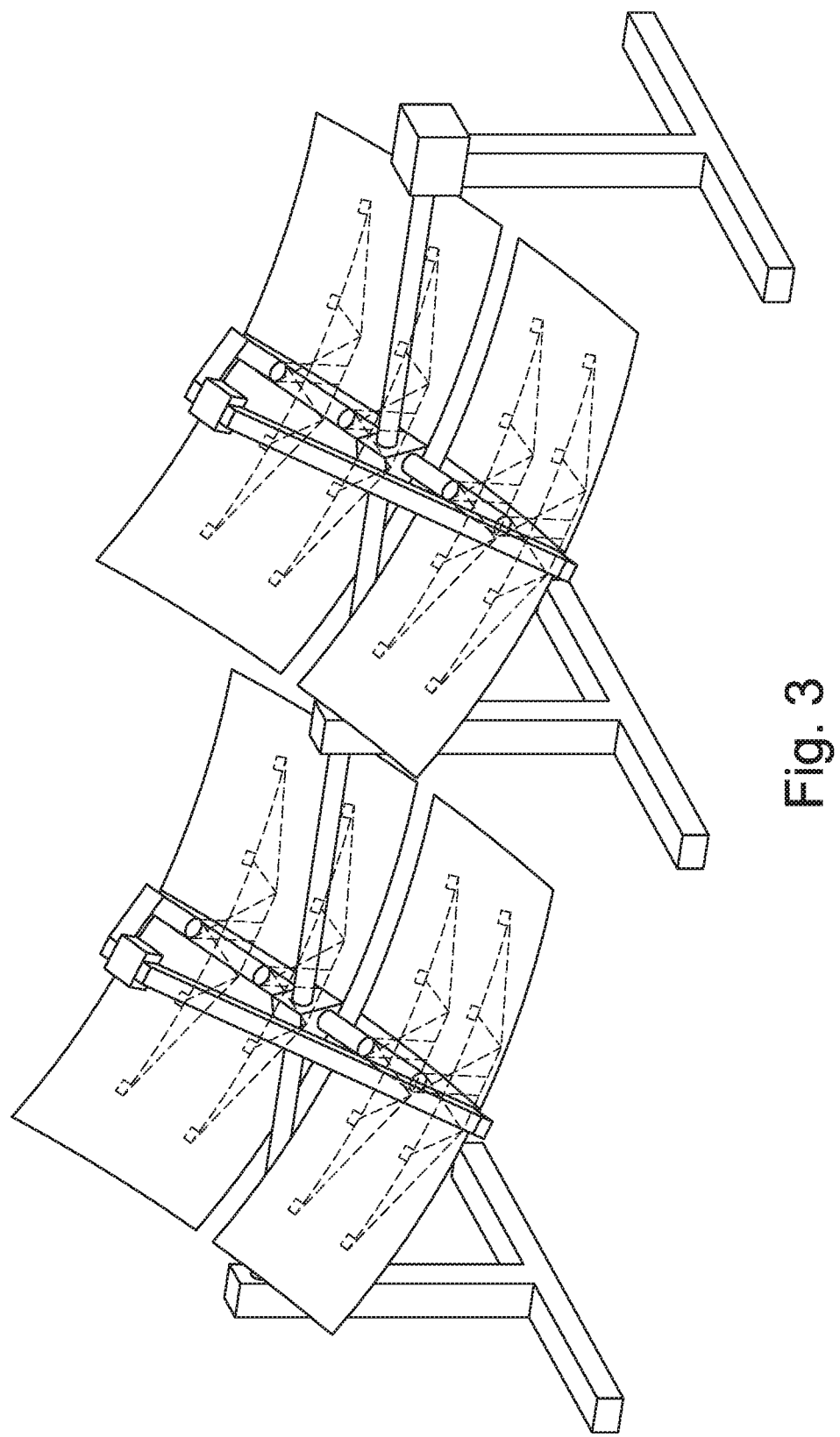
FIG. 3 shows a schematic view of an embodiment a solar generator unit.

Another embodiment of an advantageous row arrangement of two solar generator units 10 is shown in the illustration in FIG. 2. Only the differences from the illustration in FIG. 1 are explained below. The light converters 20 of the individual solar generator units are coupled in a non-positive way in the manner of a parallelogram linkage by means of a mechanical holding fixture 100, which preferably comprises a push rod. In addition, the second actuators 60, 61 on the second shafts 36 are eliminated, which is to say each of the second shafts is supported only radially. The two second shafts 36 of the solar generator units 10 are additionally coupled by the mechanical holding fixture 100 along with the coupling by the first shaft 34. The mechanical holding fixture 100 is coupled to an actuator 120 by a rod 110 whose length can be varied through rotation. By the means that the actuator 120 rotates the rod 110 about its longitudinal axis, the second shafts are rotated about their axes of rotation by a horizontal change in position of the push rod 100. Only two actuators overall are required for tracking of the two solar generator units 10.

It should be noted that more than two solar generator units can also be attached and, for example according to the embodiment from the illustration in FIG. 2, all mirror arrays can be made to track the sun position with only two actuator units.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar generator unit for converting sunlight, the solar generator unit comprising:
   a mirror array adapted to concentrate received sunlight;
   a light converter arranged above the mirror array in a direction of incident sunlight, the concentrated sunlight striking a receiver surface of the light converter, the light converter being coupled in a fixed manner to the mirror array so that the light converter is carried along during tracking of the mirror array;
   a support configured to hold the mirror array, the support having an essentially horizontal first shaft that has a first radial bearing and a second radial bearing arranged on mutually opposite sides of the mirror array, the mirror array being connected to a second shaft, the mirror array having multiple segments, a first gap being formed between a portion of the multiple segments, and the first gap having a clear opening substantially equal to at least a diameter of the first shaft;
   a tracking unit configured to cause the mirror array to track the sun position during the course of a day; and
   a third radial bearing on the first shaft for accommodating the second shaft, wherein the second shaft is that is substantially perpendicular to the first shaft and is flange-mounted to the first shaft between the first bearing and the second bearing so that an axis of rotation of the second shaft is pivoted along with a rotation of the first shaft; and
   an actuator arranged at the third radial bearing to rotate the second shaft,
   wherein the first shaft supports a weight of the second shaft, mirror array, and light converter, and
   wherein the tracking unit is adapted to cause the mirror array to track a sun position by rotation of the first shaft and of the second shaft.

2. The solar generator unit according to claim 1, wherein the first and second shafts are torsion tubes.

3. The solar generator unit according to claim 1, wherein all segments of the mirror array are supported by the second shaft.

4. The solar generator unit according to claim 1, wherein a portion of the segments of the mirror array connected to the second shaft form a second gap, and the second gap has a clear opening substantially equal to at least the diameter of the second shaft.

5. The solar generator unit according to claim 1, wherein the third bearing is flange-mounted at a third bearing point essentially in a center of the second shaft with respect to a longitudinal extent of the second shaft.

6. The solar generator unit according to claim 1, wherein the support is designed to transfer a weight of the segments that are connected to the second shaft to the first shaft.

7. The solar generator unit according to claim 1, wherein a center of gravity of the mirror array is located essentially at the axis of rotation of the first shaft.

8. The solar generator unit according to claim 1, wherein the mirror array has four mirror segments that concentrate the light onto a receiver surface of the light converter, and wherein two segments at a time form a gap for accommodating the first shaft or second shaft.

9. The solar generator unit according to claim 1, wherein the mirror array has exactly four mirror segments, and wherein two segments are connected in a fixed manner to each half of the second shaft.

10. The solar generator unit according to claim 1, wherein the first shaft has a single actuator for rotation.

11. The solar generator unit according to claim 1, wherein multiple solar generator units are arranged on a common first shaft.

12. The solar generator unit according to claim 2, wherein multiple second shafts are provided, and wherein the multiple second shafts are coupled to one another such that when one of the multiple second shafts is rotated, the coupled second shafts are rotated with it.

13. The solar generator unit according to claim 1, wherein the first bearing point and the second bearing are aligned with a center axis of the first shaft.

14. The solar generator unit according to claim 1, wherein the light converter comprises a solar cell or a steam generator.

15. The solar generator unit according to claim 1, wherein the tracking unit controls the actuator.

* * * * *